(12) United States Patent
Oikawa et al.

(10) Patent No.: US 7,016,216 B2
(45) Date of Patent: Mar. 21, 2006

(54) FERROELECTRIC MEMORY DEVICE HAVING FERROELECTRIC CAPACITOR AND METHOD OF READING OUT DATA THEREFROM

(75) Inventors: Kohei Oikawa, Kamakura (JP); Shinichiro Shiratake, Yokohama (JP); Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 96 days.

(21) Appl. No.: 10/680,394

(22) Filed: Oct. 8, 2003

(65) Prior Publication Data

US 2004/0125642 A1 Jul. 1, 2004

(30) Foreign Application Priority Data

Dec. 25, 2002 (JP) ............................. 2002-374209

(51) Int. Cl.
*G11C 11/22* (2006.01)
(52) U.S. Cl. .................................................... 365/145
(58) Field of Classification Search ................ 365/145, 365/149, 63, 65; 257/104, 105, 106
See application file for complete search history.

(56) References Cited

U.S. PATENT DOCUMENTS

| | | | |
|---|---|---|---|
| 5,761,109 A | 6/1998 | Takashima et al. | |
| 5,903,492 A * | 5/1999 | Takashima | ............... 365/145 |
| 6,094,370 A * | 7/2000 | Takashima | ............... 365/145 |
| 6,198,654 B1 * | 3/2001 | Ashikaga | ............... 365/145 |
| 6,229,728 B1 * | 5/2001 | Ono et al. | ............... 365/145 |
| 6,262,910 B1 * | 7/2001 | Takata et al. | ............... 365/145 |
| 6,320,782 B1 * | 11/2001 | Takashima | ............... 365/145 |
| 6,388,915 B1 * | 5/2002 | Kato et al. | ............... 365/145 |
| 6,473,331 B1 | 10/2002 | Takashima | |
| 6,487,104 B1 | 11/2002 | Takashima | |
| 6,493,251 B1 | 12/2002 | Hoya et al. | |

FOREIGN PATENT DOCUMENTS

| | | |
|---|---|---|
| JP | 9-82083 | 3/1997 |
| JP | 10-255483 | 9/1998 |
| JP | 2002-93153 | 3/2002 |
| JP | 2002-170382 | 6/2002 |

* cited by examiner

*Primary Examiner*—Daniel Robinson
(74) *Attorney, Agent, or Firm*—Oblon, Spivak, McClelland, Maier & Neustadt, P.C.

(57) ABSTRACT

A ferroelectric memory device includes memory cells, a memory cell block, a sense amplifier, a precharge circuit, a bit line drive circuit, and a plate line drive circuit. Each of the memory cells has a cell transistor and a ferroelectric capacitor in between a source and drain of the cell transistor. The memory cell block includes the memory cells that are series connected between a bit line via a block select transistor and a plate line. The sense amplifier amplifies data read out from the memory cell, and generates one of a first potential and a second potential higher than the first potential in accordance with the read-out data. The precharge circuit precharges the bit line at a third potential that is higher than the first potential and lower than the second potential. The bit line drive circuit sets the bit line at a fourth potential.

13 Claims, 13 Drawing Sheets

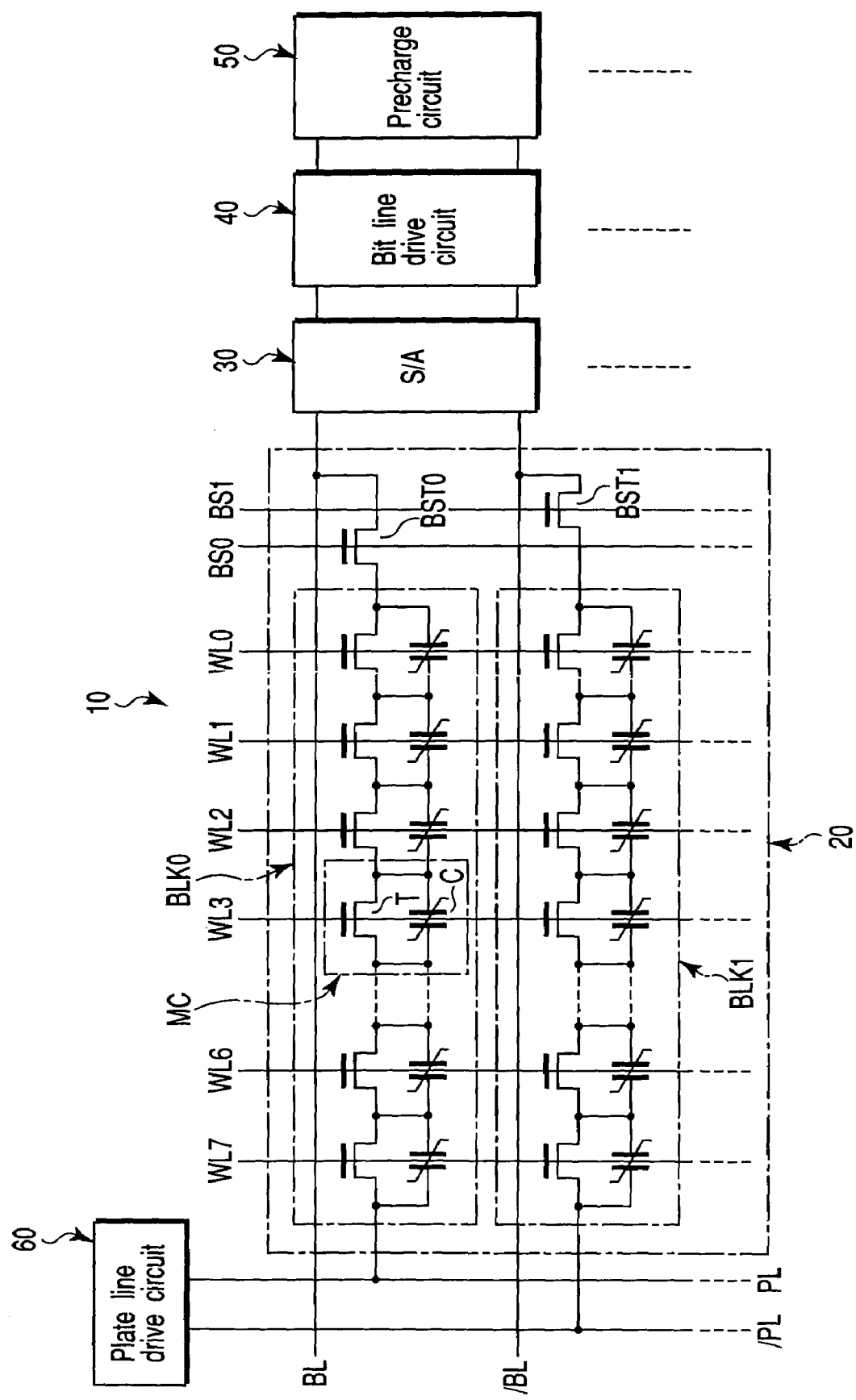
F I G. 2A

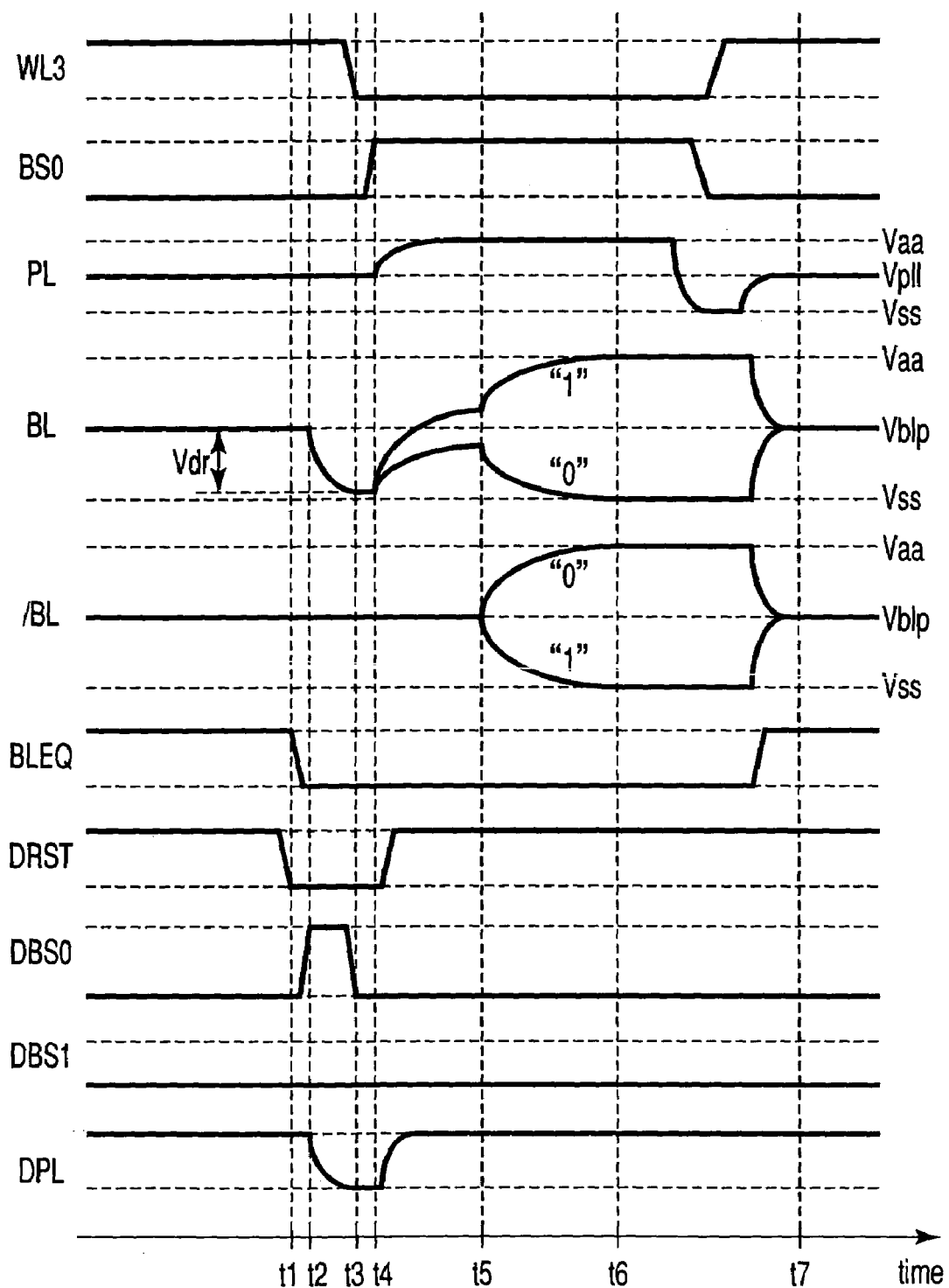
F I G. 11

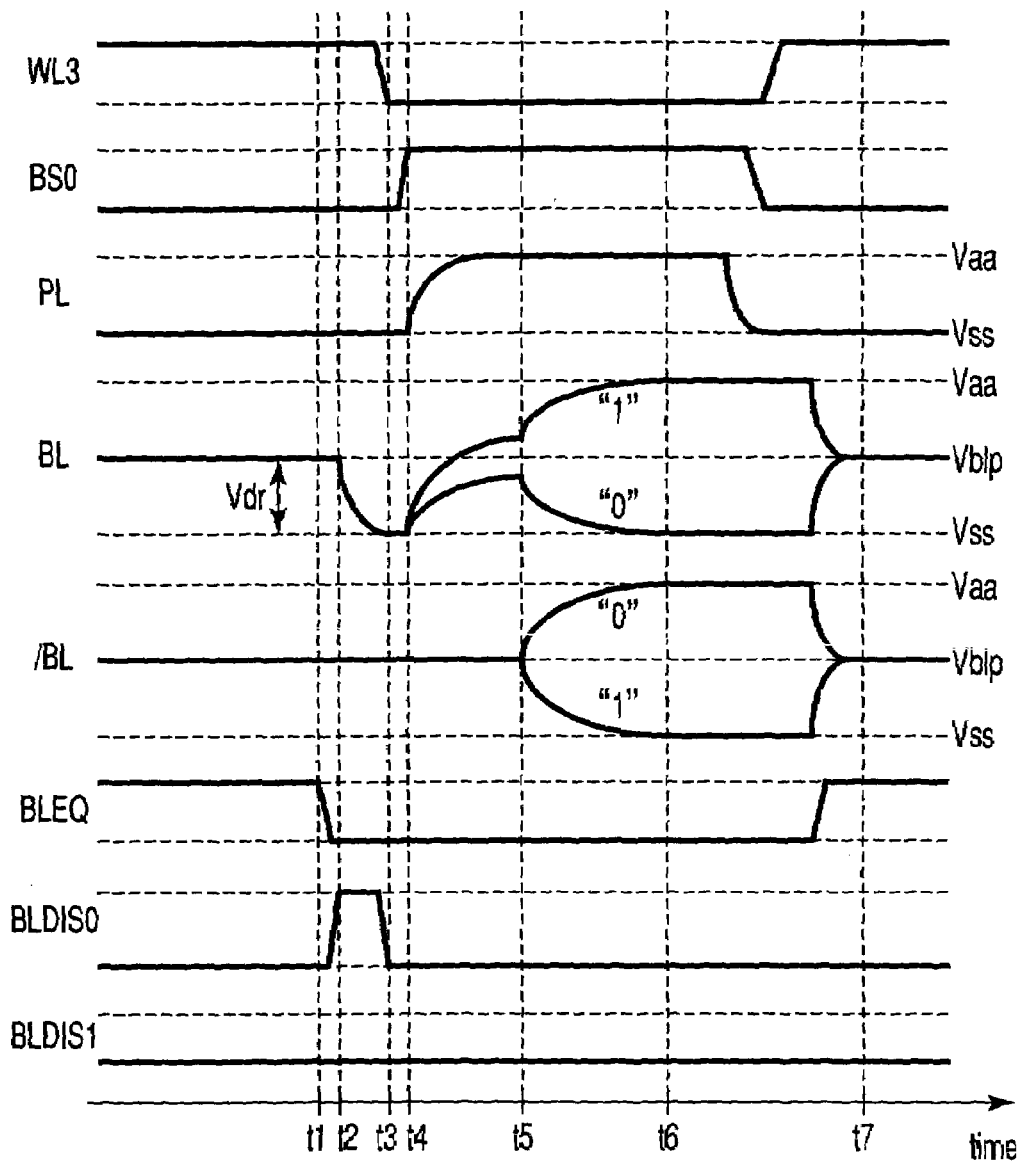
F I G. 14B

FERROELECTRIC MEMORY DEVICE HAVING FERROELECTRIC CAPACITOR AND METHOD OF READING OUT DATA THEREFROM

CROSS-REFERENCE TO RELATED APPLICATIONS

This application is based upon and claims the benefit of priority from the prior Japanese Patent Application No. 2002-374209, filed Dec. 25, 2002, the entire contents of which are incorporated herein by reference.

BACKGROUND OF THE INVENTION

1. Field of the Invention

The present invention relates to a ferroelectric memory device and a method of reading out data from the ferroelectric memory device.

2. Description of the Related Art

In recent years, attention has been paid to a ferroelectric memory device, as a semiconductor memory device, which has a ferroelectric capacitor wherein a ferroelectric material is used as a capacitor insulating film. As a ferroelectric memory device, there is known, for example, a memory which consists of series connected memory cells each having a transistor (T) having a source terminal and a drain terminal and a ferroelectric capacitor (C) in between said two terminals, hereafter named "series connected TC unit type ferroelectric RAM". The series connected TC unit type ferroelectric RAM is disclosed in Jpn. Pat. Appln. KOKAI Publication No. 10-255483, for instance. In the series connected TC unit type ferroelectric RAM, a plurality of unit cells share a plate line drive circuit. Thus, compared to conventional ferroelectric memory devices, the integration density of the memory cell array can be increased.

A data read-out method for a conventional series connected TC unit type ferroelectric RAM will now be briefly described with reference to FIG. 1. FIG. 1 is a timing chart of a word line WL potential, a block select signal BS, a plate line PL potential, a bit line pair BL & /BL potential.

In a standby state, all word lines WL are set at "H" level (cell transistors are turned on), and the block select signal BS is set at "L" level (a block select transistor is turned off). In addition, the plate line PL and the bit line pair BL & /BL are pre-charged at potential Vss (e.g. ground potential).

In a subsequent active state, the selected word line is set at "L" level and the block select signal BS is set at "H" level (time t1, t2). As a result, data is read out of the selected memory cell, and the potential of the bit line BL rises (t2 to t3). At the same time, the potential of bit line /BL rises by a reference potential Vref that is a reference for judging "0" data and "1" data. At time t3, a sense amplifier amplifies the data read out to the bit line BL. Specifically, if data is read out, and as a result, the potential of the bit line BL is lower than that of the bit line /BL, the read-out data is determined to be "0" data, and the bit line BL potential is amplified up to Vss. On the other hand, if the potential of the bit line BL is higher than that of the bit line /BL, the read-out data is determined to be "1" data and the bit line BL potential is amplified up to Vaa (e.g. internal power supply voltage).

Thereafter, the active state of the RAM is returned to the standby state, and the potentials of bit line pair BL & /BL are precharged at Vss.

In this manner, the data read-out is carried out in the series connected TC unit type ferroelectric RAM. However, the power consumption tends to increase in this prior-art data read-out method for the series connected TC unit type ferroelectric RAM. In particular, in the active state, the potential of the bit line /BL needs to be raised by the reference potential Vref, and the rise in power consumption due to this factor is conspicuous.

BRIEF SUMMARY OF THE INVENTION

A ferroelectric memory device according to an aspect of the present invention comprises:

memory cells each having a cell transistor having a source terminal and a drain terminal and a ferroelectric capacitor in between the two terminals;

a memory cell block including the memory cells that are series connected between a first terminal and a second terminal, the first terminal being connected to a bit line via a block select transistor, the second terminal being connected to a plate line, and the cell transistor having a gate connected to a word line;

a sense amplifier which amplifies data read out from the memory cell to the bit line, and generates one of a first potential and a second potential higher than the first potential in accordance with the read-out data;

a precharge circuit which precharges the bit line at a third potential that is higher than the first potential and lower than the second potential;

a bit line drive circuit which sets the bit line precharged by the precharge circuit at a fourth potential; and a plate line drive circuit which supplies a potential to the plate line.

A data read-out method according to another aspect of the present invention for a ferroelectric memory device which consists of series connected memory cells each having a transistor having a source terminal and a drain terminal and a ferroelectric capacitor in between the two terminals comprises:

precharging at a first potential a first bit line connected via a block select transistor to one end of a memory cell block including the series connected memory cells, and precharging at a second potential a plate line connected to the other end of the memory cell block;

reading out data from the memory cell to the first bit line; and amplifying a potential of the first bit line to one of a third potential that is lower than the first potential and a fourth potential that is higher than the first potential, in accordance with the data read out of the memory cell.

BRIEF DESCRIPTION OF THE SEVERAL VIEWS OF THE DRAWING

FIG. 2A is a block diagram of a ferroelectric memory device according to a first embodiment of the present invention;

FIG. 11 is a timing chart of various signals at the time of data read-out of the ferroelectric memory device according to the third embodiment;

FIG. 14B is a timing chart of various signals at the time of data read-out of a ferroelectric memory device according to a modification of the fourth embodiment.

DETAILED DESCRIPTION OF THE INVENTION

Figure 1:
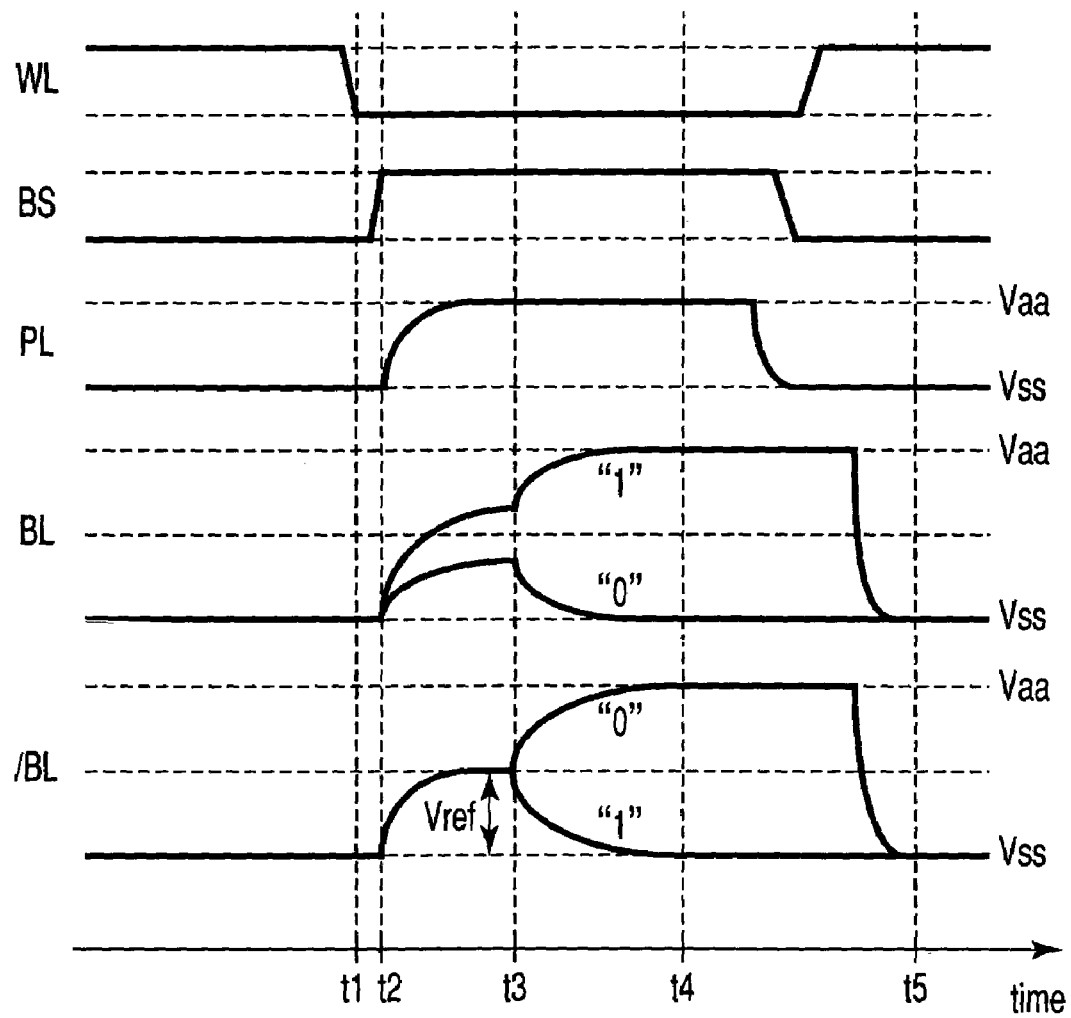
FIG. 1 is a timing chart of various signals at the time of data read-out of a conventional ferroelectric memory device.

A ferroelectric memory device according to a first embodiment of the present invention and a data read-out method thereof will now be described with reference to FIG. 2A. This embodiment refers to, by way of example, a memory which consists of series connected memory cells each having a transistor (T) having a source terminal and a drain terminal and a ferroelectric capacitor (C) in between said two terminals, hereinafter named "series connected TC unit type ferroelectric RAM." FIG. 2A is a block diagram showing an example of the structure of a main part of the ferroelectric memory device.

As is shown in FIG. 2A, a ferroelectric memory device 10 comprises a memory cell array 20, a sense amplifier 30, a bit line drive circuit 40, a precharge circuit 50 and a plate line drive circuit 60.

The memory cell array 20 comprises an (m+1) number of memory cell blocks BLK0, BLK1, . . . , BLKm (m=a natural number; FIG. 2A showing only BLK0 and BLK1), and an (m+1) number of block select transistors BST0, BST1, . . . , BSTm (FIG. 2A showing only BST0 and BST1). The memory cell block BLK0, BLK1, . . . , BLKm comprises a plurality of series connected memory cells MC. In FIG. 2A, each memory cell block comprises eight memory cells MC. Needless to say, the number of memory cells MC is not limited to this. Alternatively, 16 memory cells MC or 32 memory cells MC may be provided in each memory cell block. The memory cell MC includes a MOS transistor T and a ferroelectric capacitor C. The ferroelectric capacitor C is a capacitor element using a ferroelectric material for a capacitor insulating film. Examples of the ferroelectric material are lead zirconate titanate (Pb—Zr—Ti—O: PZT), and strontium-bismuth tantalate (Sr—Bi—Ta—O: SBT). One of the electrodes of a ferroelectric capacitor C is connected to the source of the associated cell transistor T, and the other electrode of the ferroelectric capacitor C is connected to the drain of the cell transistor T. The source of the cell transistor T is connected to the drain of a cell transistor T of an adjacent memory cell MC on one side, and the drain of the cell transistor T is connected to the source of a cell transistor T of an adjacent memory cell MC on the other side. The gate electrodes of the cell transistors T of the memory cells MC are connected to the word lines WL0 to WL7, respectively. The sources of the cell transistors T of memory cells MC connected to the word line WL7, i.e. memory cells MC connected to the endmost source side, are connected to the plate line pair PL & /PL. In addition, the drains of the cell transistors T of memory cells MC connected to the word line WL0, i.e. memory cells MC connected to the endmost drain side, are connected to the bit line pair BL & /BL via the block select transistors BST0, BST1, . . . , BSTm. Specifically, the source of the block select transistor BST0, BST1, . . . , BSTm is connected to the drain of the cell transistor T connected to the word line WL0, and the drain thereof is connected to the bit line BL or /BL. In addition, block select signals BS0, BS1, . . . , BSm (FIG. 2A showing only BS0 and BS1) are supplied to the gates of the block select transistors BST0, BST1, . . . , BSTm.

Figure 2B:
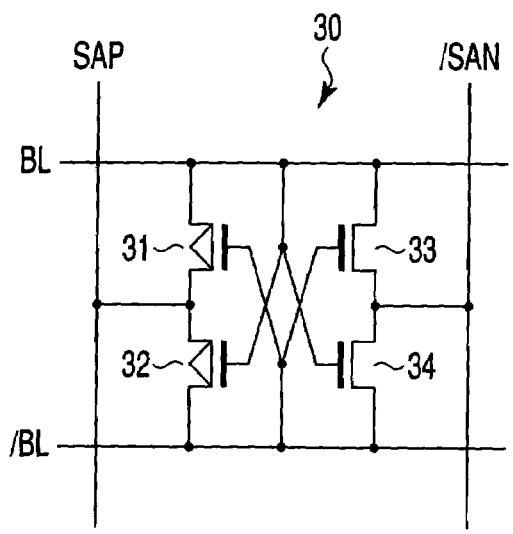
FIG. 2B is a circuit diagram of a sense amplifier provided in the ferroelectric memory device according to the first embodiment.

The sense amplifier 30 amplifies data read out to the bit line BL, /BL. The structure of the sense amplifier 30 will now be described with reference to FIG. 2B. FIG. 2B is a circuit diagram of the sense amplifier 30.

As is shown in FIG. 2B, the sense amplifier 30 comprises p-channel MOS transistors 31 and 32 and n-channel MOS transistors 33 and 34. The current paths (source-drain paths) of the two p-channel MOS transistors 31 and 32 are series-connected between the bit line pair BL & /BL. The gates of the p-channel MOS transistors 31 and 32 are connected to the bit lines /BL and BL. A control signal SAP is supplied to a connection node of both transistors 31 and 32. The current paths of the two n-channel MOS transistors 33 and 34 are series-connected between the bit line pair BL & /BL. The gates of the n-channel MOS transistors 33 and 34 are connected to the bit lines /BL and BL. A control signal /SAN is supplied to a connection node of both transistors 33 and 34.

Figure 2C:
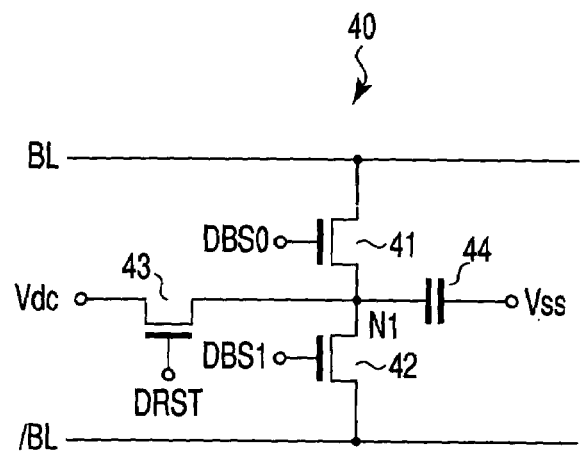
FIG. 2C is a circuit diagram of a bit line drive circuit provided in the ferroelectric memory device according to the first embodiment.

The bit line drive circuit 40 controls, in the active state, the potential of one of the bit lines BL and /BL, to which the selected memory cell is connected. To be more specific, when data is to be read out to the bit line BL, the potential of the bit line BL is decreased from the precharge potential by a potential Vdr. The potential Vdr has an intermediate value between a variation amount of the bit line BL potential at the time of reading out "1" data from the selected memory cell and a variation amount of the bit line BL potential at the time of reading out "0" data from the selected memory cell. Hereinafter, the potential Vdr is referred to as "reference potential". On the other hand, when data is to be read out to the bit line /BL, the bit line /BL potential is decreased from the precharge level by the reference potential Vdr. The structure of the bit line drive circuit 40 will now be described with reference to FIG. 2C. FIG. 2C is a circuit diagram of the bit line drive circuit 40.

As is shown in FIG. 2C, the bit line drive circuit 40 comprises n-channel MOS transistors 41 to 43 and a capacitor element 44. The current paths of the two n-channel MOS transistors 41 and 42 are series-connected between the bit line pair BL & /BL. Control signals DBS0 and DBS1 are supplied to the gates of the n-channel MOS transistors 41 and 42. The current path of the n-channel MOS transistor 43 is connected between a connection node of the two n-channel MOS transistors 41 and 42, on the one hand, and a node of potential Vdc, on the other hand. A control signal DRST is supplied to the gate of the n-channel MOS transistor 43. The capacitor element 44 is connected between a connection node of the two n-channel MOS transistors 41 and 42, on the one hand, and a node of potential Vss, on the other.

Figure 2D:
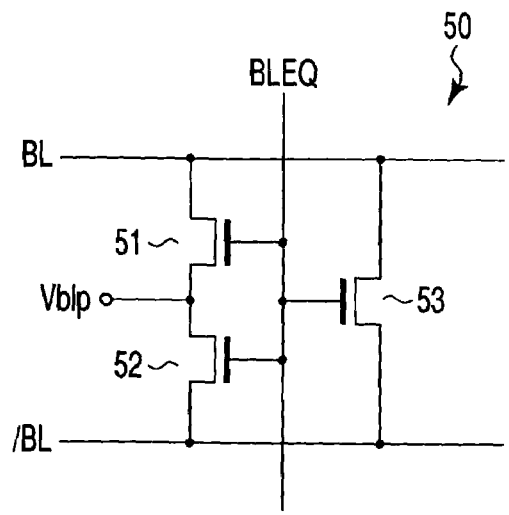
FIG. 2D is a circuit diagram of a precharge circuit provided in the ferroelectric memory device according to the first embodiment.

In the standby state, the precharge circuit 50 precharges the bit line pair BL & /BL, and equalizes the potentials of the bit lines BL and /BL so as to eliminate a potential difference therebetween. The structure of the precharge circuit 50 will now be described with reference to FIG. 2D. FIG. 2D is a circuit diagram of the precharge circuit 50.

As is shown in FIG. 2D, the precharge circuit 50 includes three n-channel MOS transistors 51 to 53. The current path of two n-channel MOS transistors 51 and 52 is series-connected between the paired bit lines BL and /BL. A connection node of the two n-channel MOS transistors 51 and 52 is connected to a node of potential Vblp. The current path of the n-channel MOS transistor 53 is connected between the paired bit lines BL and /BL. A control signal BLEQ is supplied to the gates of the three n-channel MOS transistors 51 to 53. In the standby state, the bit line pair BL & /BL are precharged at potential Vblp. The precharge level Vblp is an intermediate level between "0" data (potential Vss) and "1" data (potential Vaa) amplified by the sense amplifier 30.

In the standby state, the plate line drive circuit 60 precharges the plate lines PL and /PL. At the time of data read-out in the active state, the plate line drive circuit 60 sets one of the plate lines PL and /PL, to which the selected memory cell MC is connected, at a predetermined potential. The structure of the plate line drive circuit 60 is not shown, since it is the same as the conventional one.

Figure 3A:
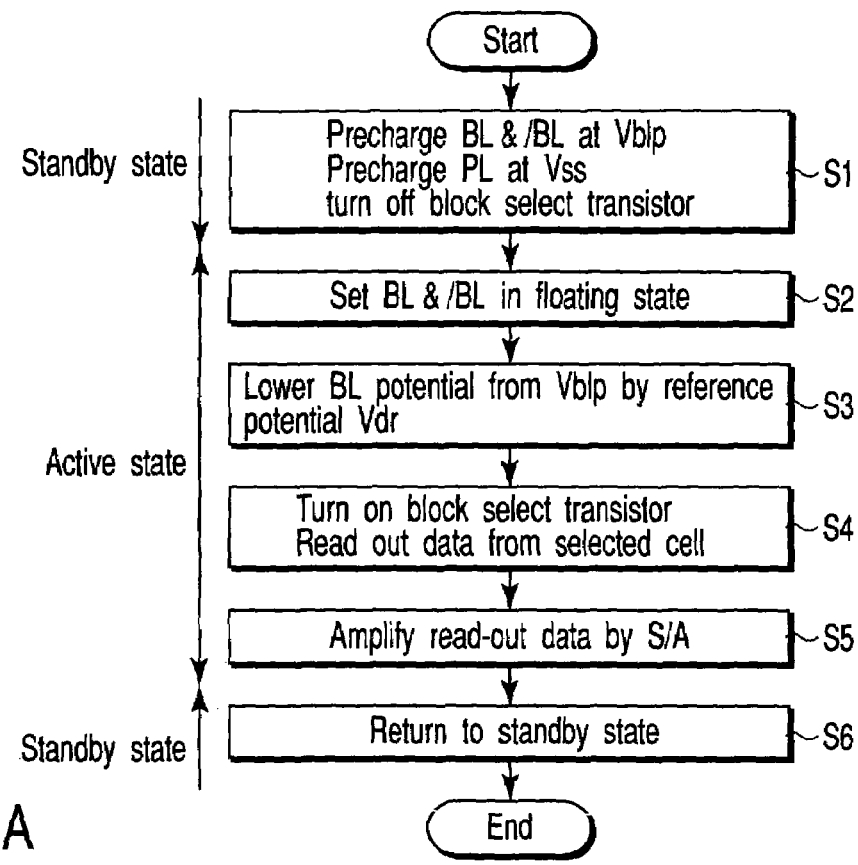
FIG. 3A is a flow chart illustrating a data readout method of the ferroelectric memory device according to the first embodiment.
Figure 3B:
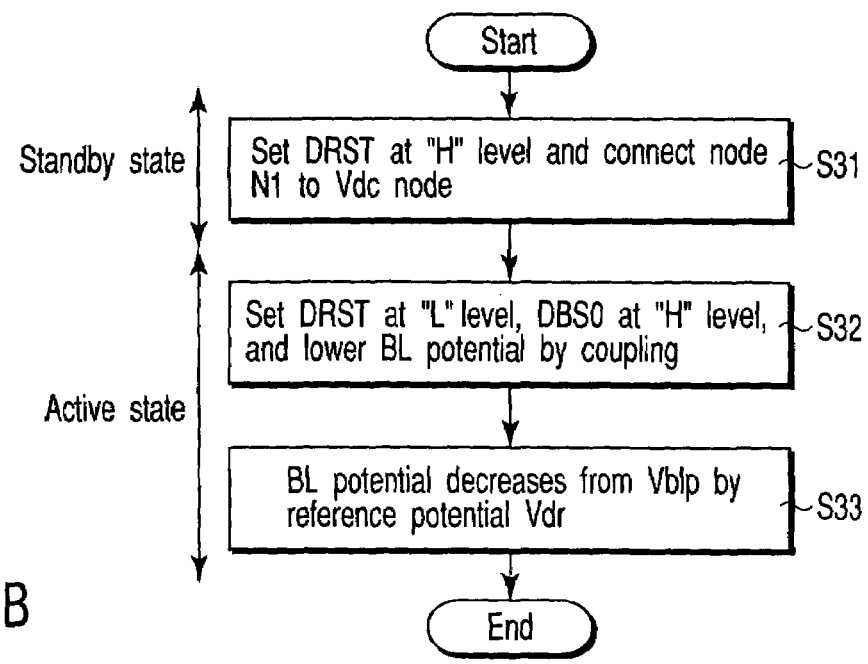
FIG. 3B is a flow chart illustrating a part of a data read-out method of the ferroelectric memory device according to the first embodiment.
Figure 4:
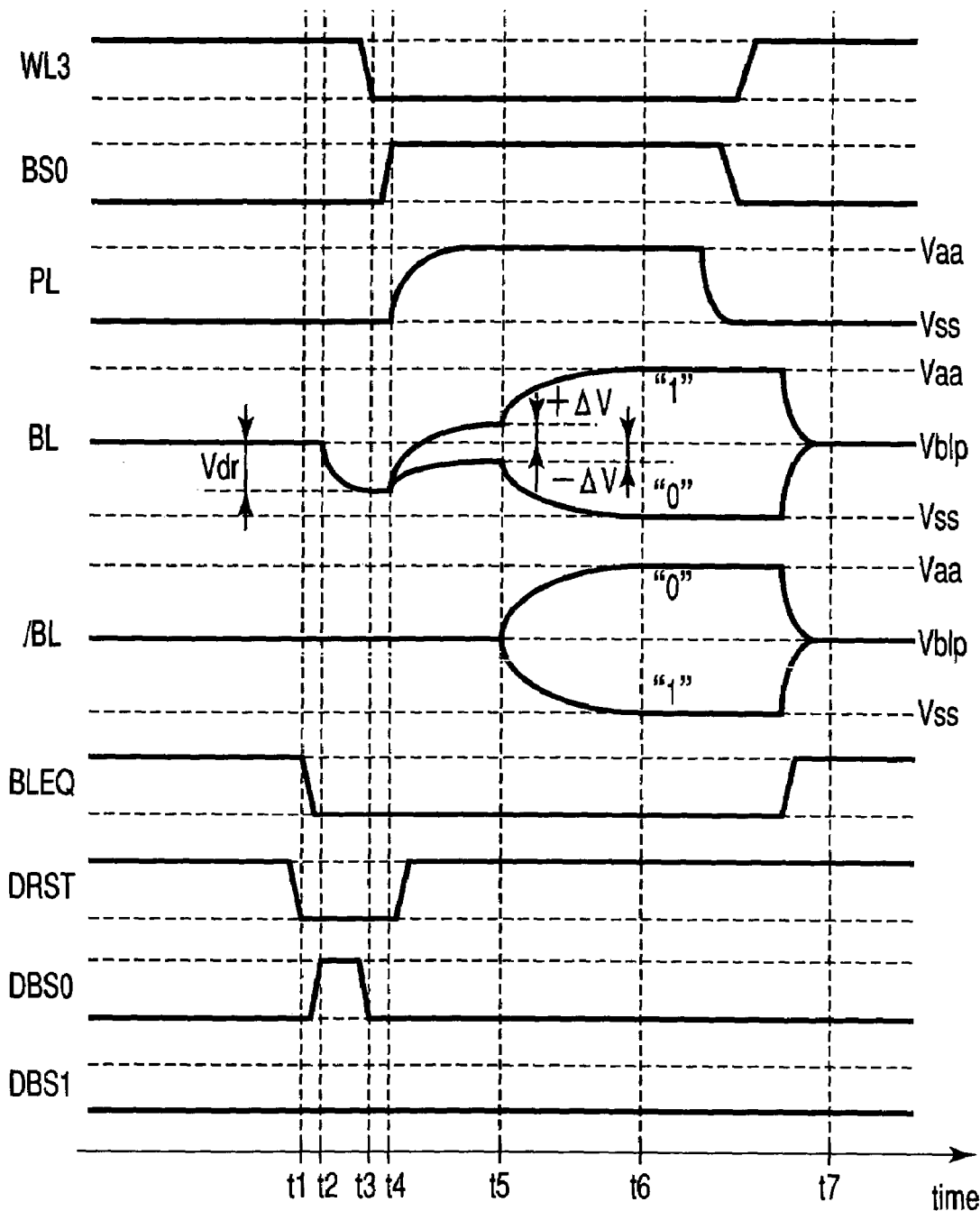
FIG. 4 is a timing chart of various signals at the time of data read-out of the ferroelectric memory device according to the first embodiment.

A data read-out method of the ferroelectric memory device having the above-described structure will now be described with reference to FIGS. 3A, 3B and 4. FIGS. 3A and 3B are flow charts illustrating the data read-out method of the series connected TC unit type ferroelectric RAM according to the present embodiment. In particular, attention is paid to the potentials of the bit line pair BL & /BL. FIG. 4 is a timing chart of various signals. In this description, like FIG. 2A, attention is paid to only the two memory cell blocks BLK0 and BLK1 in the memory cell array 20. Assume that data is read out from the memory cells MC connected to the word line WL3.

In the standby state, the bit line pair BL & /BL and the plate line PL are precharged (step S1). Specifically, the control signal BLEQ is set at "H" level, and the precharge circuit 50 is activated. Thereby, the n-channel MOS transistors 51 to 53 of the precharge circuit 50 are turned on (see FIG. 2D), and the bit line pair BL & /BL are precharged at potential Vblp. The plate line PL is precharged at potential Vss. The precharge level Vblp of the bit lines is, e.g. (Vaa+Vss)/2. For example, the potential Vaa is an internal power supply potential and the potential Vss is a ground potential. It should be noted that there is no problem if the precharge level Vblp is between the potentials Vaa and Vss.

In the standby state, the block select signals BS0 and BS1 are set at "L" level by a row decoder. Accordingly, the block select transistors BST0 and BST1 are turned off. In addition, the row decoder supplies positive potentials to all the word lines WL0 to WL7, and the cell transistors T are turned on.

Besides, in the bit line drive circuit 40, the control signal DRST is set at "H" level and the control signals DBS0 and DBS1 are set at "L" level. Accordingly, the node N1 is in the state of cut-off from the bit line pair BL & /BL, and the potential of note N1 is set at Vdc.

In the sense amplifier 30, the potentials of the sense amplifier control signals SAP and /SAP are set at a precharge level, e.g. (Vaa+Vss)/2. Thus, the sense amplifier 30 is rendered inactive.

In order to read out data from the memory cell, the state of the ferroelectric memory device is changed from the standby state to the active state. At time t1, the control signal BLEQ is set at "L" level, and the precharge circuit 50 is inactivated. Thereby, the bit line pair BL & /BL are set in the floating state in the precharge level (step S2). In order to read out data from the memory cell, the bit line BL potential is lowered from the precharge level by the reference potential Vdr (step S3). This step is necessary in order to determine whether the data read out of the memory cell is "0" data or "1" data. This step will now be described in greater detail with reference to FIG. 3B.

Since the control signal DRST is set at "H" level, as mentioned above, the potential of the node N1 is Vdc (step S31).

At time t1, the control signal DRST is set at "L" level. Then, at time t2, the control signal DBS0 is set at "H" level (step S32). Thereby, the node N1 of the bit line drive circuit 40 is electrically connected to the bit line BL. Consequently, the potential of the bit line BL lowers due to coupling with the capacitor element 44. As a result, the potential of the bit line BL lowers from the precharge level Vblp by the reference potential Vdr (step S33).

In this manner, the bit line BL potential is decreased from the precharge level by the reference potential Vdr. The magnitude of the reference potential Vdr is determined by the variation amount of the bit line BL potential at the time of reading out "0" data and "1" data. Specifically, the reference potential Vdr needs to be set in the following manner. When "0" data has been read out, the bit line BL potential becomes lower than the bit line /BL potential (precharge level). On the other hand, when "1" data has been read out, the bit line BL potential becomes higher than the bit line /BL potential. The reference potential Vdr can be set by adjusting the potential Vdc and controlling the amount of charge that is precharged in the capacitor element 44.

At time t3, if the bit line BL potential has lowered to (Vblp−Vdr), the control signal DBS0 is set at "L" level. Thereby, the node N1 of bit line drive circuit 40 is electrically disconnected from the bit line BL.

At time t4, data is read out of the memory cell (step S4). The row decoder decodes the row address and selects the word line WL3. Thereby, the cell transistors T connected to the word line WL3 are turned off. In addition, the row decoder sets the block select signal BS0 at "H" level and turns on the block select transistor BST0. Thus, the bit line BL of potential (Vblp−Vdr) is electrically connected to the selected memory cell. Further, the plate line drive circuit 60 supplies the potential Vaa to the plate line PL. As a result, the potential of the bit line BL varies in accordance with the data stored in the selected memory cell. Specifically, when "0"

data is stored in the memory cell, the potential of the bit line BL becomes lower than the precharge level of the bit line /BL by −ΔV. On the other hand, when "1" data is stored in the memory cell, the potential of the bit line BL becomes higher than the precharge level of the bit line /BL by +ΔV.

Subsequently, the potential of the sense amplifier drive signal SAP is changed from the precharge level to the internal power supply potential Vaa, and the potential of the sense amplifier drive signal /SAN is changed from the precharge level to the ground potential Vss. As a result, the sense amplifier 30 is activated. The activated sense amplifier 30 senses the potential difference −ΔV or +ΔV between the paired bit lines and amplifies the potential difference (step S5). Hence, when "0" data is stored in the memory cell, the bit line BL potential lowers to the potential of the sense amplifier drive signal /SAN, i.e. the ground potential Vss, and the bit line /BL potential rises to the potential of the sense amplifier drive signal SAP, i.e. the internal power supply potential Vaa. On the other hand, when "1" data is stored in the memory cell, the bit line BL potential rises to the potential of the sense amplifier drive signal SAP and the bit line /BL potential lowers to the potential of the sense amplifier drive signal /SAN.

In this way, the data stored in the memory cell is read out. After the data read-out, data restore is carried out and the memory device is returned to the standby state (step S6). Specifically, the potentials of the sense amplifier drive signals SAP and /SAN are set at the precharge level, the control signal BLEQ is set at "H" level, and the bit lines BL and /BL are set at the precharge level Vblp.

According to the ferroelectric memory device using the above-described data read-out method, the power consumption at the time of read-out can be reduced. This advantage will now be described with reference to FIG. 4.

According to the data read-out method of this embodiment, the precharge level of the bit lines is set at the potential Vblp between Vaa and Vss. The potentials Vaa and Vss are the bit line BL potentials at the time of amplifying the "1" data and "0" data by means of the sense amplifier. That is, after the read-out of data, the potential of one of the bit line pair BL & /BL is Vaa, and the potential of the other is Vss. Thus, in order to precharge the bit line pair BL & /BL after the data read-out, the charge on the high-potential (Vaa) bit line can be utilized. For example, charge of the bit line with the high potential is transferred via the transistor 53 of the precharge circuit to the bit line with the lower potential (Vss). Thereby, the potentials of the bit line pair BL & /BL can be made closer to the precharge level Vblp. Accordingly, the power consumption can be reduced at the time of precharge. In particular, if the precharge circuit is configured such that the transistor 53 can first be turned on before the transistors 51 and 52 are turned on, the power consumption can further be reduced. If the precharge level is set at (Vaa+Vss)/2, the efficiency of re-use of the charge of the high-potential bit line can be maximized.

The above point will now be compared with the prior art. According to the conventional data read-out method, as described with reference to FIG. 1, the potential of the bit line /BL needs to be raised by the reference potential Vref (time t2). In the present embodiment, this step corresponds to the lowering of the bit line BL potential from the precharge level Vblp by the reference potential Vdr. In the prior-art method, power is consumed since the potential has to be increased. By contrast, in the method of this embodiment, power is hardly consumed since the potential is decreased. The power needed for data read-out is equal in the prior art and in the present embodiment. When the active state is returned to the standby state, the precharge level is the ground potential Vss in the prior-art method, and thus little power is consumed when the active state is restored to the standby state. In the method of the present embodiment, as described above, the charge of the high-potential bit line is utilized for the precharge, and the power consumption can be reduced. Therefore, according to the method of this embodiment, the power consumption can be reduced by the amount that is needed, in the prior art, when the bit line /BL potential prior to the data read-out is increased by the reference potential Vref.

Figure 5:
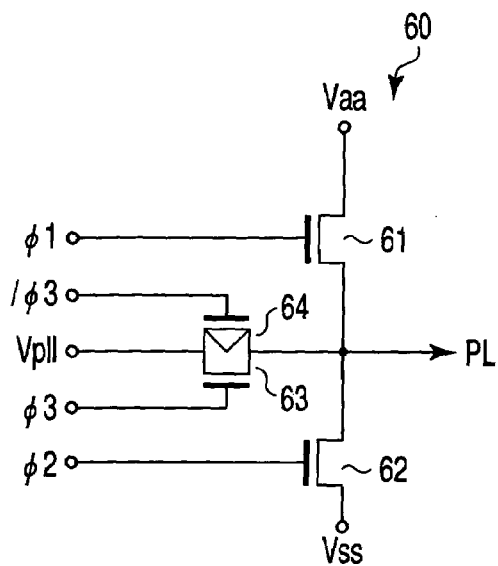
FIG. 5 is a circuit diagram of a plate line drive circuit provided in a ferroelectric memory device according to a second embodiment of the present invention.

A ferroelectric memory device according to a second embodiment of the present invention and a data read-out method thereof will now be described. This embodiment refers to, by way of example, a series connected TC unit type ferroelectric RAM. In the series connected TC unit type ferroelectric RAM according to the second embodiment, a plate line drive circuit shown in FIG. 5 is applied to the structure shown in FIGS. 2A to 2D, which has been described in connection with the first embodiment. FIG. 5 is a circuit diagram of the plate line drive circuit.

As is shown in FIG. 5, the plate line drive circuit 60 comprises n-channel MOS transistors 61 to 63 and a p-channel MOS transistor 64. The current paths of the n-channel MOS transistors 61 and 62 are series-connected between a potential Vaa (internal power supply potential) and a potential Vss (ground potential). Control signals φ1 and φ2 are supplied to the gates of the n-channel MOS transistors 61 and 62. The current path of the n-channel MOS transistor 63 and p-channel MOS transistor 64 is connected between a connection node of the n-channel MOS transistors 61 and 62 and a connection node of potential Vpll. Control signals φ3 and /φ3 are supplied to the gates of the n-channel MOS transistor 63 and p-channel MOS transistor 64. The potential of the connection node of the n-channel MOS transistors 61 and 62 is supplied to the plate line PL.

Figure 6:
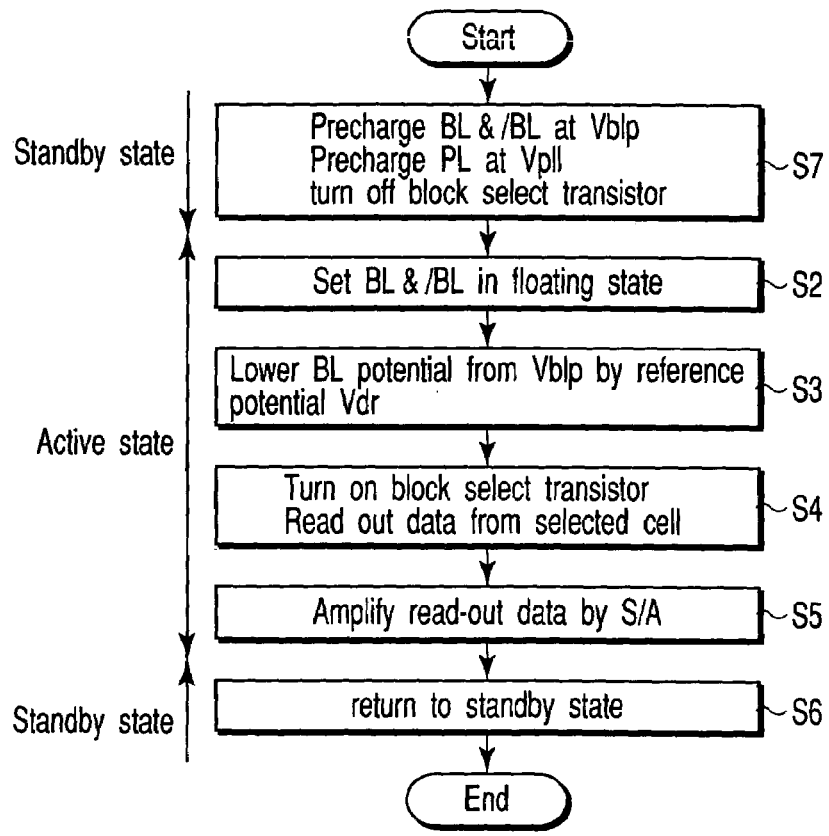
FIG. 6 is a flow chart illustrating a part of a data read-out method of the ferroelectric memory device according to the second embodiment.
Figure 7:
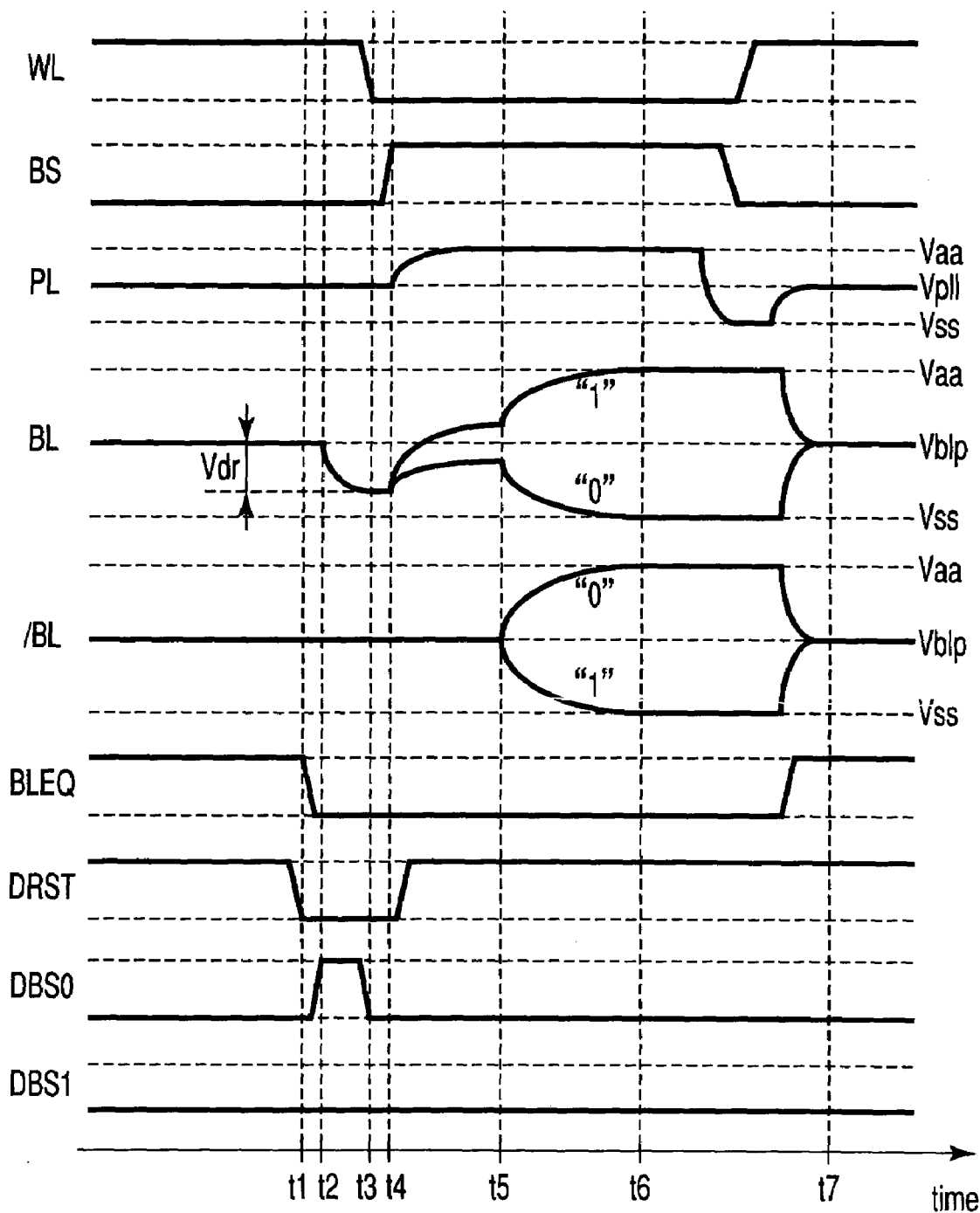
FIG. 7 is a timing chart of various signals at the time of data read-out of the ferroelectric memory device according to the second embodiment.

Referring to FIGS. 6 and 7, a data read-out method of the ferroelectric memory of the second embodiment will now be described. FIG. 6 is a flow chart illustrating the data read-out method of the series connected TC unit type ferroelectric RAM according to the present embodiment. In particular, attention is paid to the potentials of the bit line pair BL & /BL. FIG. 7 is a timing chart of various signals. In this description, like the first embodiment, attention is paid to only the two memory cell blocks BLK0 and BLK1 in the memory cell array 20, as shown in FIG. 2A. Assume that data is read out from the memory cells MC connected to the word line WL3.

In the standby state, the bit line pair BL & /BL are precharged at a precharge level Vblp (step S7). The method of precharging the bit line pair BL & /BL is the same as in the first embodiment. In addition, the plate line PL is precharged at a precharge level Vpll by the plate line drive circuit 60 (step S7). Specifically, in the plate line drive circuit 60 shown in FIG. 5, the control signals φ1 and φ2 are set at "L" level and the control signal φ3 is set at "H" level. Thereby, the n-channel MOS transistors 61 and 62 are set in the off-state, while the n-channel MOS transistor 63 and p-channel MOS transistor 64 are set in the on-state. As a result, the precharge-level potential Vpll is supplied to the plate line PL. The precharge level Vpll is a potential between the potentials Vaa and Vss, and it is, like Vblp, (Vaa+Vss)/2, for instance.

The block select transistors BST0 and BST1 are in the off-state. Further, the node N1 in the bit line drive circuit 40 is electrically disconnected from the bit line pair BL & /BL, and the sense amplifier 30 is not active.

The state of the ferroelectric memory device is changed from the standby state to the active state. At time t1, like the first embodiment, the bit line pair BL & /BL are set in the floating state in the precharge level Vblp (step S2). Then, the bit line BL potential is lowered from the precharge level Vblp by the reference potential Vdr (step S3).

At time t4, data is read out of the memory cell (step S4). The row decoder selects the word line WL3, and the block select transistor BST0 is turned on. In addition, the plate line drive circuit 60 supplies the potential Vaa to the plate line PL. To be more specific, in the plate line drive circuit 60 shown in FIG. 5, the control signal φ1 is set at "H" level and the control signals φ2 and φ3 are set at "L" level. Accordingly, the n-channel MOS transistor 61 is turned on, and the n-channel MOS transistors 62 and 63 and p-channel MOS transistor 64 are turned off. As a result, the potential Vaa is supplied to the plate line PL.

Subsequently, like the first embodiment, the sense amplifier 30 amplifies the data read out to the bit line BL (step S5). Then, data restore is carried out and the memory device is returned to the standby state (step S6). As has been described above, the bit lines BL and /BL are precharged at the precharge level Vblp and the plate line PL is precharged at the precharge level Vpll.

According to the ferroelectric memory device using the above-described read-out method, the bit line precharge level is set at the potential Vblp between Vaa and Vss. Thus, like the first embodiment, the power consumption at the time of read-out can be reduced.

Figure 8:
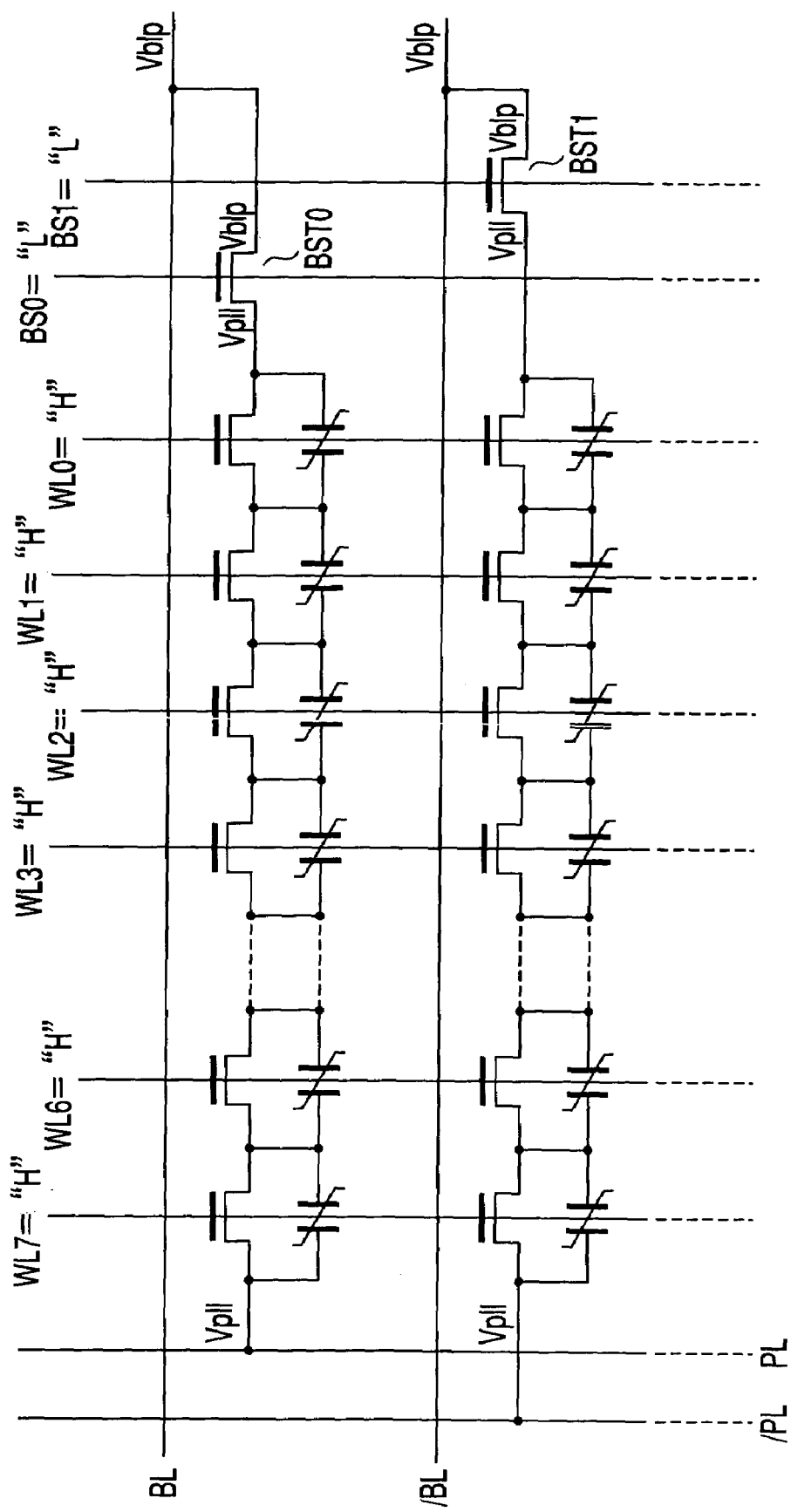
FIG. 8 is a block diagram showing the ferroelectric memory device according to the second embodiment at the standby state.

In addition to this advantage, the following advantage can be obtained: the occurrence of leak current in the block select transistor can be suppressed. This advantage will now be explained referring to FIG. 8. FIG. 8 is a circuit diagram of the memory cell array of the series connected TC unit type ferroelectric RAM.

In the standby state of the series connected TC unit type ferroelectric RAM, the block select signal is set at "L" level, and the block select transistor is turned off. On the other hand, all word lines are set at "H" level and the cell transistors T are turned on. Thus, in the standby state, a potential difference between the plate line precharge level and the bit line precharge level is applied across the source and drain of the block select transistor. In the prior art, the plate line precharge level is the ground potential Vss. By contrast, in the present embodiment, |Vpll−Vblp| is applied across the source and drain of the block select transistor. The plate line precharge level Vpll is a potential between Vss and Vaa. Therefore, compared to the prior art, the source/drain potential difference of the block select transistor can be reduced. In particular, when Vpll=Vblp, the source/drain potential difference of the block select transistor is substantially zero. As a result, the occurrence of leak current in the block select transistor can be suppressed, and the operational reliability of the ferroelectric memory can be enhanced.

Furthermore, by setting the plate line precharge level Vpll between Vaa and Vss, the operational stability of the ferroelectric memory can be improved. In general, a semiconductor circuit is stable with the signal of "L" level. However, as mentioned above, the "H" level potential is applied to all word lines in the standby state of the series connected TC unit type ferroelectric RAM. This is not preferable in terms of operational stability. According to the present embodiment, however, the plate line precharge level Vpll is set between Vaa and Vss. It can thus be regarded that the word line potential is decreased relative to the prior art. Therefore, the operational stability of the ferroelectric memory device can be enhanced.

Figure 9:
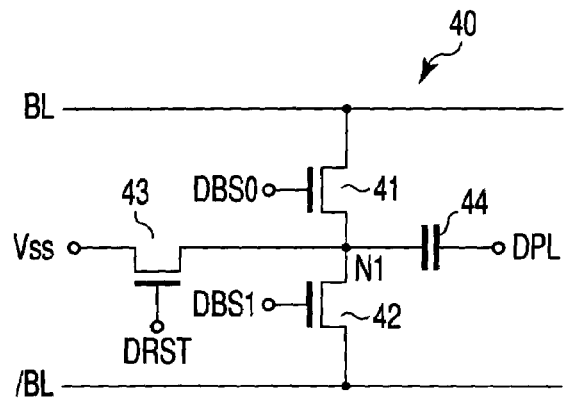
FIG. 9 is a circuit diagram of a bit line drive circuit provided in a ferroelectric memory device according to a third embodiment of the invention.

A ferroelectric memory device according to a third embodiment of the present invention and a data read-out method thereof will now be described. This embodiment refers to, by way of example, a series connected TC unit type ferroelectric RAM. In the series connected TC unit type ferroelectric RAM according to the third embodiment, a bit line drive circuit as shown in FIG. 9 is substituted in the second embodiment. FIG. 9 is a circuit diagram of the bit line drive circuit.

As is shown in FIG. 9, in the bit line drive circuit 40 of the third embodiment, the structure of the first embodiment as shown in FIG. 2C is modified such that the current path of the n-channel MOS transistor 43 is connected between the node N1 and a node of potential Vss and the capacitor element 44 is connected between the node N1 and a node of a control signal DPL.

Figure 10:
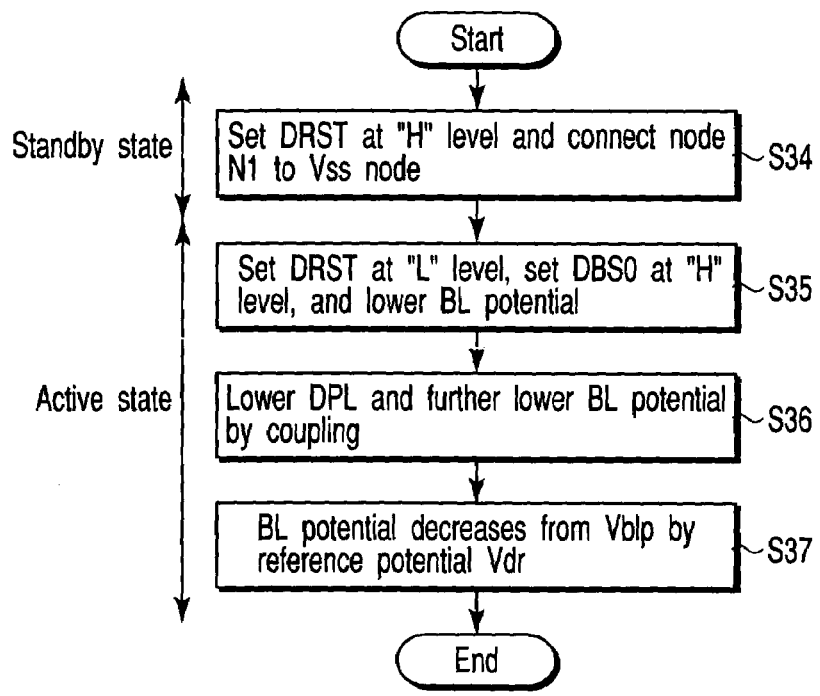
FIG. 10 is a flow chart illustrating a part of a data read-out method of the ferroelectric memory device according to the third embodiment.

The method of data read-out of the ferroelectric memory device with the above structure will now be described. The data read-out method of this embodiment is the same as that of the second embodiment except that the bit line potential is decreased from the precharge level by a reference potential Vdr. This point alone will be described here. FIG. 10 is a flow chart illustrating the process of decreasing the bit line potential from the precharge level by the reference potential Vdr, and FIG. 11 is a timing chart of various signals.

As has been described in connection with the second embodiment, the bit line pair BL & /BL are set in the floating state at the precharge level Vblp. In the bit line drive circuit 40 in the standby state, the control signal DRST is set at "H" level and the node N1 is connected to the Vss node (step S34). In this case, since the control signals DBS0 and DBS1 are at "L" level, the node N1 is electrically disconnected from the bit line pair BL & /BL. In addition, the control signal DPL is set at "H" level (potential Vdc).

At time t1, the control signal DRST is set at "L" level. Further, at time t2, the control signal DBS0 is set at "H" level. Thereby, the bit line BL is connected to the node N1 and the potential of the bit line BL lowers (step S35). At the same time, the control signal DPL is set at "L" level (potential Vss) (step S36). As a result, due to coupling with the capacitor element 44, the bit line BL potential further lowers and the bit line potential decreases from the precharge level Vblp by the reference potential Vdr (step S37).

The subsequent operation is the same as that described in connection with the first and second embodiments.

With the ferroelectric memory device of the third embodiment, the same advantages as the first and second embodiments are obtained. In addition, according to the data read-out method of the third embodiment, one of the electrodes of the capacitor element 44 is connected to the control signal DPL node. Further, the control DPL is varied from the potential Vdc to Vss, and the bit line BL potential is decreased due to the coupling with the capacitor element 44. Therefore, compared to the first and second embodiments, the reference potential Vdr can be increased. That is, the bit line BL potential can be further lowered. Accordingly, compared to the first and second embodiments, a greater voltage can be applied to the memory cell and a greater read-out signal can be obtained. Hence, the reliability of the read-out data can be enhanced.

Figure 12:
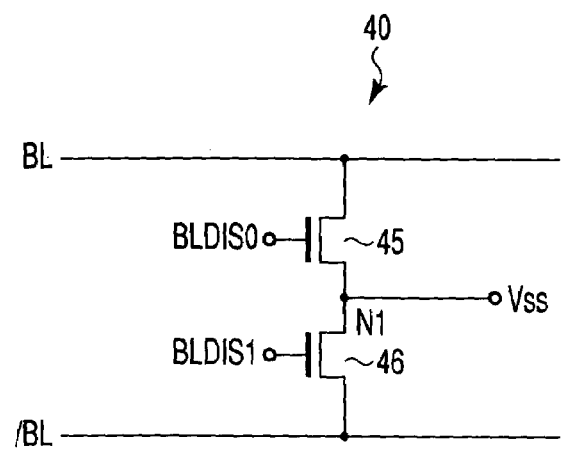
FIG. 12 is a circuit diagram of a bit line drive circuit provided in a ferroelectric memory device according to a fourth embodiment of the invention.

A ferroelectric memory device according to a fourth embodiment of the present invention and a data read-out method thereof will now be described. This embodiment refers to, by way of example, a series connected TC unit type ferroelectric RAM. In the series connected TC unit type ferroelectric RAM according to the fourth embodiment, a bit line drive circuit as shown in FIG. 12 is substituted in the second embodiment. FIG. 12 is a circuit diagram of the bit line drive circuit.

As is shown in FIG. 12, the bit line drive circuit 40 of the fourth embodiment comprises two n-channel MOS transistors 45 and 46. The current path of the n-channel MOS transistors 45 and 46 is series-connected between the paired bit lines BL and /BL. Control signals BLDIS0 and BLDIS1 are supplied to the gates of the n-channel MOS transistors 45 and 46. The connection node N1 of the two n-channel MOS transistors 45 and 46 is connected to the ground potential Vss.

Figure 13:
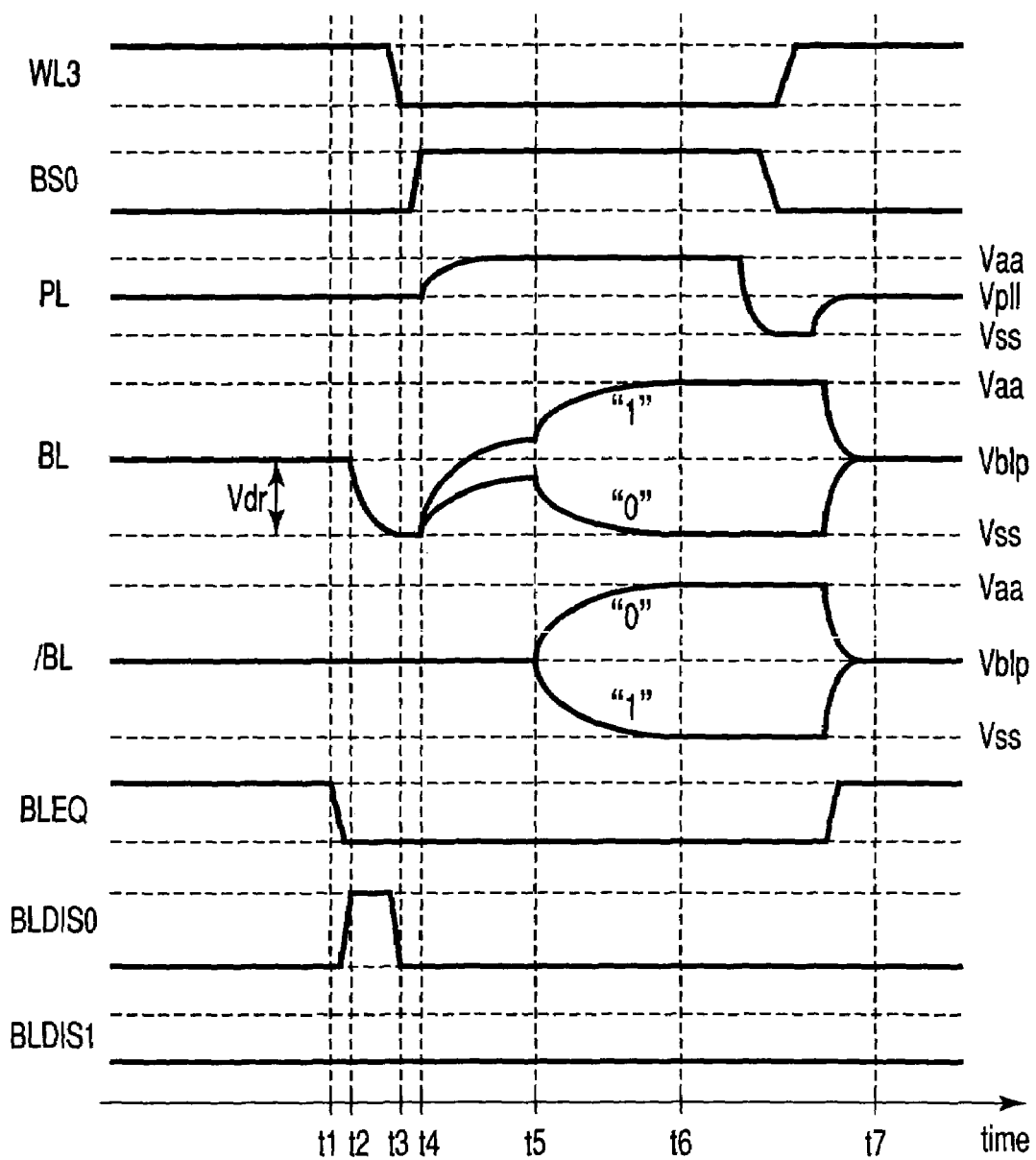
FIG. 13 is a timing chart of various signals at the time of data read-out of the ferroelectric memory device according to the fourth embodiment.

The method of data read-out of the ferroelectric memory device with the above structure will now be described. The data read-out method of this embodiment is the same as that of the second embodiment except that the bit line potential is decreased from the precharge level by a reference potential Vdr. This point alone will be described here. FIG. 13 is a timing chart of various signals.

As has been described in connection with the second embodiment, at time t1, the control signal BLEQ is set at "L" level and the bit line pair BL & /BL are set in the floating state at the precharge level Vblp. Then, at time t2, the control signal BLDIS0 is set at "H" level. As a result, the bit line BL is connected to the potential Vss via the node N1, and the bit line BL potential lowers to Vss. That is, in this embodiment, the reference potential Vdr is (Vblp−Vss).

The subsequent operation is the same as that described in connection with the first and second embodiments.

With the ferroelectric memory device of the fourth embodiment, the same advantages as the first and second embodiments are obtained. In addition, according to the data read-out method of the fourth embodiment, when the bit line BL potential is decreased from the precharge level Vblp by the Vdr, the bit line BL is connected to the ground potential Vss. Therefore, compared to the third embodiment, the reference potential Vdr can be increased. That is, the bit line BL potential can be further lowered. Accordingly, compared to the third embodiment, a greater voltage can be applied to the memory cell and a greater read-out signal can be obtained. Hence, the reliability of the read-out data can be enhanced. Furthermore, in the fourth embodiment, the bit line precharge level Vblp is a boundary potential (detection level) for determining "0" data and "1" data. In other words, when data is read out of the memory cell, if the potential variation amount of the bit line BL is smaller than (Vblp−Vss), "0" data is determined. If the potential variation amount of the bit line BL is greater than (Vblp−Vss), "1" data is determined.

As has been described above, according to the ferroelectric memory devices and the data read-out methods according to the first to fourth embodiments of the invention, the bit line precharge level Vblp is set between the "0" data potential (Vss) and "1" data potential (Vaa) which are amplified by the sense amplifier. Thus, after the data read-out, the high-potential bit line charge can be utilized for precharging the low-potential bit line. As a result, the power consumption of the ferroelectric memory device can be reduced. In particular, when the bit line precharge level Vblp is set at (Vaa+Vss)/2, the maximum advantage can be obtained.

Besides, according to the structure and method of the second embodiment, the plate line precharge level Vpll is also set between the "0" data potential and "1" data potential which are amplified by the sense amplifier. Therefore, in the standby state, the source/drain potential difference of the block select transistor can be reduced. It is thus possible to prevent a leak current from flowing to the block select transistor, and the operational reliability of the ferroelectric memory device can be enhanced. In particular, when the plate line precharge level Vpll is set to be equal to the bit line precharge level Vblp, the maximum advantage can be obtained. Furthermore, since the word line potential can be relatively decreased in the standby state, the operational stability of the ferroelectric memory device can be enhanced.

According to the structures and methods of the third and fourth embodiments, the reference potential can further be increased. Accordingly, a still greater read-out signal can be obtained, and the reliability of the read-out operation of the ferroelectric memory device can be enhanced.

Figure 14A:
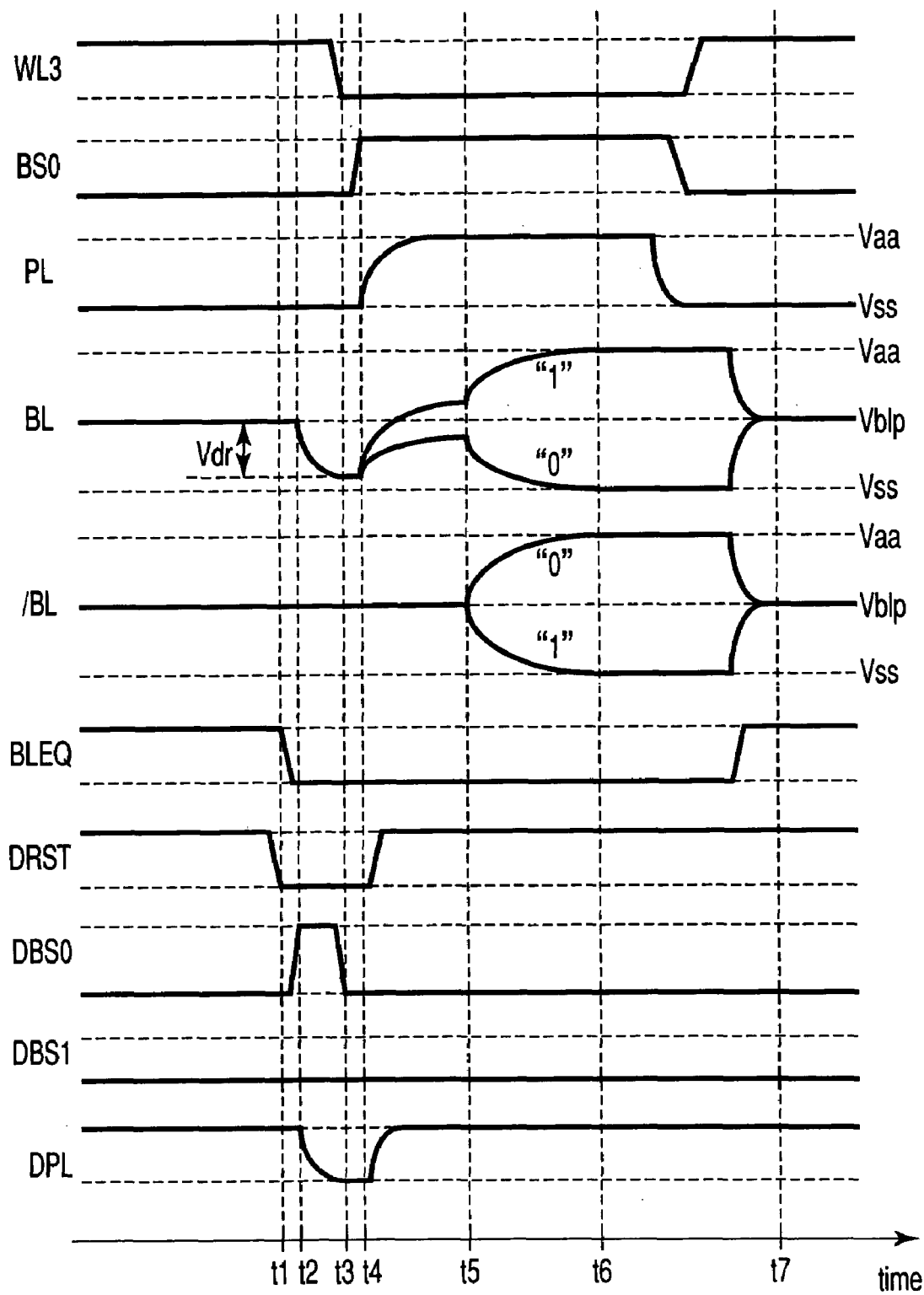
FIG. 14A is a timing chart of various signals at the time of data read-out of a ferroelectric memory device according to a modification of the third embodiment.

In the third and fourth embodiments, the bit line drive circuits of FIGS. 9 and 12 are applied to the structure of the second embodiment. However, the structures of FIGS. 9 and 12 may be applicable to the structure of the first embodiment. FIGS. 14A and 14B are timing charts of various signals in such cases. In these cases, since the plate line precharge level is Vss, the advantage described in connection with the second embodiment is not obtained. However, the advantages described in connection with the first and third embodiments and those described in connection with the first and fourth embodiments can be obtained, respectively.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A ferroelectric memory device comprising:
   memory cells each having a cell transistor having a source terminal and a drain terminal and a ferroelectric capacitor in between said two terminals;
   a memory cell block including the memory cells that are series connected between a first terminal and a second terminal, the first terminal being connected to a bit line via a block select transistor, the second terminal being connected to a plate line, and the cell transistor having a gate connected to a word line;
   a sense amplifier which amplifies data read out from the memory cell to the bit line, and generates one of a first potential and a second potential higher than the first potential in accordance with the read-out data;
   a precharge circuit which precharges the bit line at a third potential that is higher than the first potential and lower than the second potential;
   a bit line drive circuit which sets the bit line precharged by the precharge circuit at a fourth potential; and
   a plate line drive circuit which supplies a potential to the plate line.

2. The ferroelectric memory device according to claim 1, wherein the plate line drive circuit precharges the plate line at a fifth potential that is higher than the first potential and lower than the second potential.

3. The ferroelectric memory device according to claim 2, wherein the fifth potential is equal to the third potential.

4. The ferroelectric memory device according to claim 1, wherein a potential difference between the first potential and the third potential is substantially equal to ½ of a potential difference between the first potential and the second potential.

5. The ferroelectric memory device according to claim 1, wherein the bit line drive circuit includes:
   a transistor with a current path having one end connected to the bit line; and
   a capacitor element having one electrode connected to the other end of the current path of the transistor and having the other electrode connected to the first potential.

6. The ferroelectric memory device according to claim 1, wherein the bit line drive circuit includes:
   a capacitor element having one electrode connected to a drive potential; and
   a switching element which connects the other electrode of the capacitor element to one of the first potential and the bit line, the bit line being set at a predetermined potential by control of the drive potential.

7. The ferroelectric memory device according to claim 1, wherein the bit line drive circuit includes a transistor with a current path having one end connected to the bit line and having the other end connected to the first potential.

8. The ferroelectric memory device according to claim 1, wherein the bit line drive circuit sets a potential of the bit line at the fourth potential, immediately before data is read out of the memory cell, and
   a potential difference between the third potential and the fourth potential is greater than a potential variation amount of the bit line when "0" data has been read out of the memory cell and is less than a potential variation amount of the bit line when "1" data has been read out of the memory cell.

9. A data read-out method for a ferroelectric memory device which consists of series connected memory cells each having a transistor having a source terminal and a drain terminal and a ferroelectric capacitor in between said two terminals, the method comprising:
   precharging at a first potential a first bit line connected via a block select transistor to one end of a memory cell block including the series connected memory cells, and
   precharging at a second potential a plate line connected to the other end of the memory cell block;
   reading out data from the memory cell to the first bit line; and
   amplifying a potential of the first bit line to one of a third potential that is lower than the first potential and a fourth potential that is higher than the first potential, in accordance with the data read out of the memory cell.

10. The data read-out method according to claim 9, further comprising:
   precharging a second bit line at the first potential before the reading-out of data to the first bit line; and
   setting the first bit line at a fifth potential,
   wherein the amplifying of the potential of the first bit line to one of the third potential and the fourth potential includes amplifying the potential of the first bit line to the third potential when the potential of the first bit line is lower than the potential of the second bit line when data has been read out of the memory cell, and amplifying the potential of the first bit line to the fourth potential when the potential of the first bit line is higher than the potential of the second bit line when data has been read out of the memory cell.

11. The data read-out method according to claim 10, wherein the setting of the first bit line at the fifth potential includes applying a control signal to one electrode of a capacitor element, the other electrode of which is electrically connected to the first bit line, and controlling the potential of the first bit line by coupling of the capacitor element.

12. The data read-out method according to claim 9, wherein the first potential is equal to the second potential.

13. The data read-out method according to claim 9, wherein a potential difference between the third potential and the first potential is substantially equal to ½ of a potential difference between the third potential and the fourth potential.

* * * * *